United States Patent [19]

Kuraishi

[11] Patent Number: 4,809,053
[45] Date of Patent: Feb. 28, 1989

[54] SEMICONDUCTOR DEVICE AND LEAD FRAME USED THEREFOR

[75] Inventor: Fumio Kuraishi, Nagano, Japan

[73] Assignee: Shinko Electric Industries Co., Ltd., Nagano, Japan

[21] Appl. No.: 84,203

[22] Filed: Aug. 12, 1987

[30] Foreign Application Priority Data

Aug. 12, 1986 [JP] Japan .................. 61-189262

[51] Int. Cl.$^4$ .................. H01L 23/48; H01L 23/02
[52] U.S. Cl. .................. 357/70; 357/81
[58] Field of Search .................. 357/70, 81

[56] References Cited

U.S. PATENT DOCUMENTS

| 3,868,725 | 2/1975 | DeGraaff | 357/81 |
| 3,930,115 | 12/1975 | Uden et al. | 357/81 |
| 4,514,750 | 4/1985 | Adams | 357/70 |
| 4,701,363 | 10/1987 | Barber | 357/70 |

FOREIGN PATENT DOCUMENTS

| 1200619 | 2/1986 | Canada | 357/70 |
| 0132975 | 11/1978 | Japan | 357/81 |
| 0048951 | 4/1980 | Japan | 357/70 |
| 0143558 | 8/1983 | Japan | 357/81 |
| 0152051 | 7/1986 | Japan | 357/81 |

Primary Examiner—Eugene R. LaRoche
Assistant Examiner—Michael B. Shingleton
Attorney, Agent, or Firm—Staas & Halsey

[57] ABSTRACT

A plastic molded semiconductor device which includes a metal lead frame having a heat spreader extending from a stage on which a semiconductor chip is mounted. The heat spreader is located between a periphery of the stage and inner leads located opposite to the stage. The chip is electrically connected to the inner leads by an insulative film having a plurality of conductive patterns.

6 Claims, 3 Drawing Sheets

SEMICONDUCTOR DEVICE AND LEAD FRAME USED THEREFOR

BACKGROUND OF THE INVENTION

1. Field of the Invention

This invention relates to a semiconductor device and a lead frame used therein, and more particularly, to a lead frame capable of effectively radiating heat generated from a semiconductor chip mounted thereon.

2. Description of the Related Art

A semiconductor chip is usually mounted on a lead frame and integrally molded with a plastic material. The lead frame is made of a metal strip and comprises a stage on which the chip is fixedly mounted and a plurality of leads to which the chip is connected.

Currently, semiconductor chips are larger in scale, have many functions, and are more integrated. As a result, the heat generated in a chip is increased. Therefore, the lead frame must be provided with more connecting pins (leads) and the plastic molded semiconductor device itself must have a construction that will effectively radiate the heat generated from the chip.

Because the lead frame has many inner leads, the gap between the leads must be minimized so that the number of leads can be maximized. in general, such gaps cannot be made smaller than a value corresponding approximately to a thickness of the lead frame. If the gap is smaller than the thickness of the lead frame, the metal strips will buckle inside a stamping press during their production. Therefore, there is a limit to the number of pins or leads that can be produced by a stamping process.

In a conventionally known semiconductor device, a stage of the lead frame and a plastic mold cooperate to radiate heat generated in a chip. However, considering the highly integrated semiconductor chips that have recently been developed, the above-mentioned solution is not sufficient for the necessary heat radiation.

SUMMARY OF THE INVENTION

An object of the present invention is to provide a semiconductor device and a lead frame used therein capable of overcoming the disadvantages mentioned above.

Another object of the present invention is to provide a semiconductor device and a lead frame capable of increasing the number of pins or leads, in view of recent developments of highly integrated semiconductor chips.

Still another object of the present invention is to provide a lead frame and a semiconductor device using a lead frame having a means for effectively radiating heat generated in a semiconductor chip.

According to the present invention, there is provided a semiconductor device comprising a lead frame made of a metal strip including a stage, at least one heat spreader extending from the stage for radiating heat, and a plurality of leads, each having inner and outer lead portions. A semiconductor chip is mounted on the stage and has a plurality of terminals. An insulative film is provided and includes a plurality of conductive patterns for electrically connecting the terminals of the chip to the respective inner lead portions. A plastic material for integrally molding the semiconductor chip, the insulative film, and the lead frame, is provided so that at least the outer lead portions protrude outside the plastic mold thus formed. Using the insulative film to electrically connect the terminals of the chip to the respective inner lead portions, an accurate and close connection can be attained, even if the distances from the chip to the leads are relatively long. Also, a connecting process can be easily carried out.

In addition, according to the present invention, there is provided a lead frame made of a metal strip and comprising a stage on which a semiconductor chip is mounted, a plurality of leads having respective inner ends which are arranged opposite to and away from a periphery of the stage, and at least one heat spreader extending from the periphery of the stage portion and existing in a space defined between the stage and the inner ends of the leads. It is obvious that heat generated in the semiconductor chip is transmitted to the stage and effectively radiated through the heat spreader.

DESCRIPTION OF THE PREFERRED EMBODIMENTS

Figure 1:
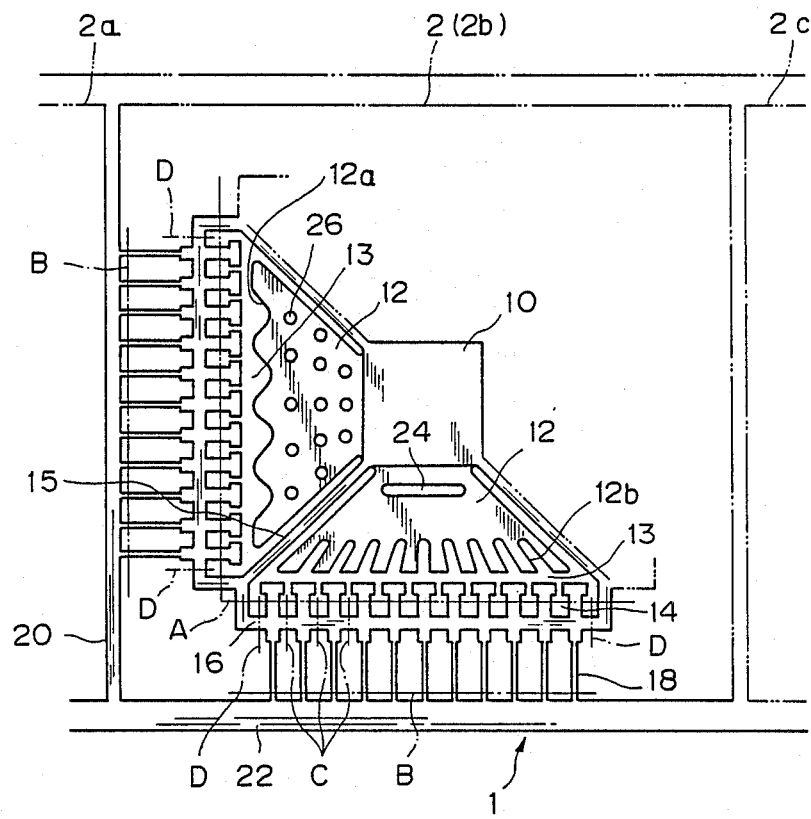
FIG. 1 is a partial plan view of a lead frame according to the present invention.

Referring now to FIG. 1, a lead frame strip 1 is formed by stamping a thin metal strip and includes a number of segments 2a, 2(2b), 2c, . . . continuously connected to each other and extends in a longitudinal direction. A square stage 10 on which a semiconductor chip (28 FIG. 4) is mounted is formed at the central portion of each segment 2.

Four stage support bars 15 extend outwardly and diagonally from the square stage 10, and the outer ends of the bars 15 are connected to respective ends of dam bars 16, each of which extends in the direction parallel to each side of the square stage 10.

A plurality of inner leads 14 extend inward from the dam bars 16 and are arranged in parallel and are equidistant to each other in such a manner that the inner ends of the respective leads 14 are positioned relatively far from the peripheral sides of the central stage 10. Therefore, the length of the inner leads 14 is relatively short, compared with that of a conventional lead frame, due to the presence of heat spreaders 12, as will be mentioned later in detail.

A plurality of outer leads 18 extend outward from the dam bars 16, opposite to the respective inner leads 14, and are arranged in parallel and equidistant to each other. The outer ends of the outer leads 18 are connected to transverse section bars 20 or longitudinal rails 22.

A heat spreader 12 extends from each side of the square stage 10 toward the above-mentioned inner leads 14. The heat spreader 12 has substantially a trapezoidal shape so as to substantially cover a trapezoidal space defined between the peripheral edge of the stage 10 and the inner leads 14.

The above-mentioned heat spreader 12 has a plurality of through holes 26 in one embodiment, or one or more slits 24 in another embodiment, in order to facilitate a tight molding of the heat spreaders 12 in a plastic material together with a semiconductor chip 28 (FIG. 2 and FIG. 4) mounted on the stage 10, as will be described later. The outer edges of the heat spreaders 12 are formed in a smooth wave-shape, as shown at 12a, or are concave and convex-shaped, as shown at 12b, to be spaced from the inner ends of the inner leads 14 in such a manner that stress concentration cannot occur when molded with a plastic material, and thus cracking is prevented after a plastic mold is formed.

In another embodiment, the stage support bars 15 may extend from the heat spreaders 12, although this is not shown in the drawings.

In a lead frame 2 according to the present invention, the number of leads 14 and 18 arranged along the longitudinal direction of the dam bars 16 can be increased, since the inner leads 14 are arranged away from the periphery of the central stage 10, as mentioned above. As a result, a lead frame 2 having multiple pins can be easily realized.

The spaces 13 thus formed between the central stage 10 and the inner leads 14 arranged away from the periphery thereof can be effectively used to arrange the above-mentioned heat spreaders 12 for spreading heat. Therefore, these spaces 13 can be advantageously used particularly for radiating heat.

Figure 2:
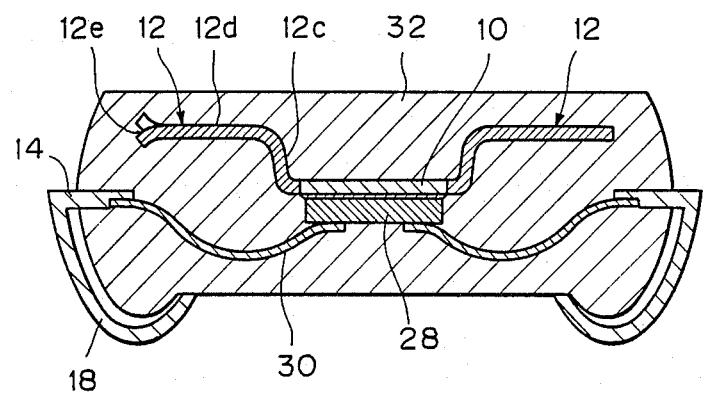
FIG. 2 is a cross-sectional view of a semiconductor device molded with a plastic material according to the present invention.

FIG. 2 is a cross-section of a semiconductor device using a lead frame as mentioned above and integrally molded in a plastic package. FIG. 2 includes a semiconductor chip 28 firmly mounted on the central stage 10 of lead frame 2, an insulated film 30 for connecting the semiconductor chip 28 to the inner leads 14, and a plastic material 32 for integrally packaging or molding these elements such as the semiconductor chip 28 and respective parts of the lead frame 2 (i.e., the stage 10, heat spreaders 12, etc.)

Before the lead frame 2 is molded with a plastic material 32, the semiconductor chip 28 is mounted on the stage 10 by a known die bonding process. Also, the heat spreaders 12 are previously bent in such a manner that each spreader 12 has a step portion 12c adjacent to the peripheral edge of the stage 10, and a main part 12d of the spreader 12 is offset to the stage 10 and positioned in the vicinity of an outer surface of the plastic mold 32 after it is molded therewith. As the main part 12d of the spreader 12 is positioned near the outer surface of the plastic mold 32, it is possible to effectively radiate the heat outside the semiconductor device via the heat spreader 12.

If the outer edge of the heat spreader 12 is wave-shaped or concave and convex-shaped, these edge portions can be bent up and down alternately, as shown at 12e, to improve the adherence to the plastic material 32.

Figure 3:
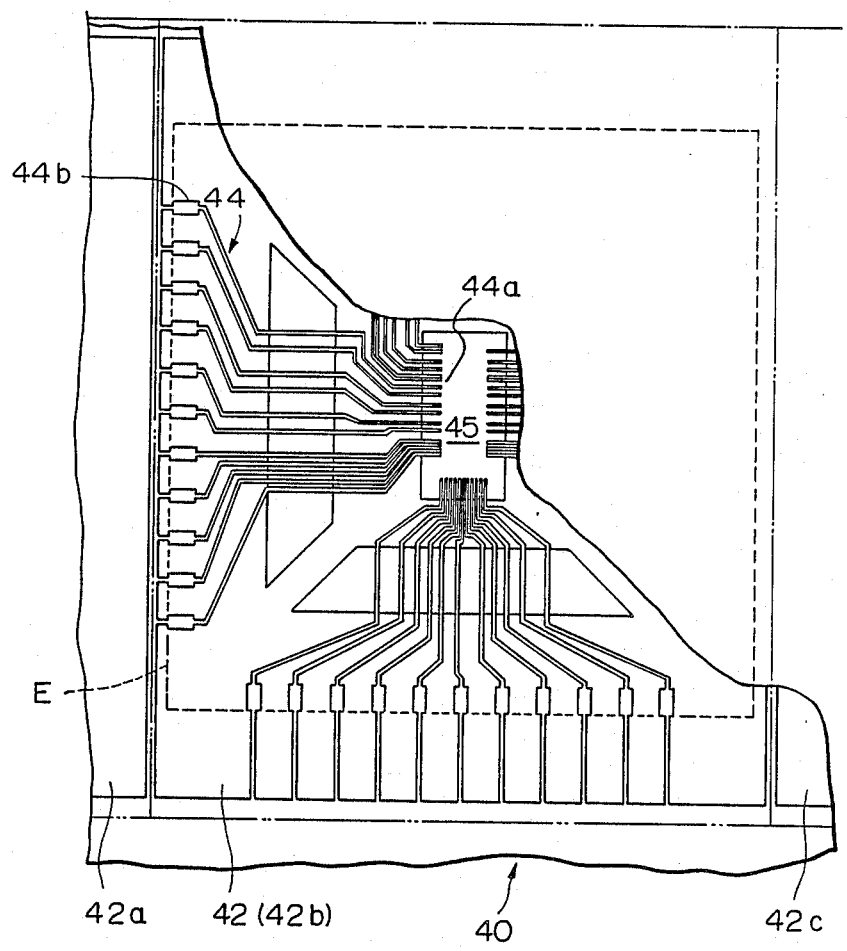
FIG. 3 is a partial plan view of a circuit pattern formed-film used in the present invention; and, FIG. 4 is a perspective view of a semiconductor chip.

Then, the semiconductor chip 28 is electrically connected to the inner leads 14 by the circuit patterned insulative film 30, as mentioned below. FIG. 3 is a plan view employing the insulative film 30 advantageously used for this purpose.

In FIG. 3, a thin insulated film 40 consists of a number of segments 42a, 42(42b), 42c, . . . continuously connected to each other and extending in the longitudinal direction. Such a film 40 can be made of an appropriate resin film laminated with a copper (Cu) foil. Each segment 42 has a number of electrically conductive patterns 44 formed in a known manner, such as etching the copper foil laminated on the insulated film. These patterns 44 extended from inner ends 44a thereof arranged around a central stage portion 45 to outer terminal portions 44b arranged along a rectangular-shaped cut line E.

Figure 4:
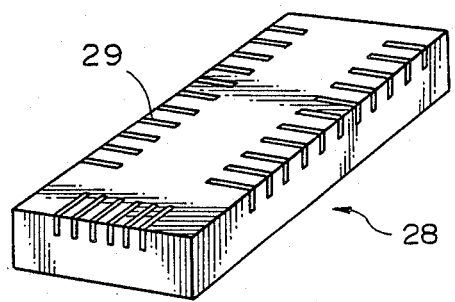

The inner ends 44a of the conductive patterns 44 are arranged in correspondence to connecting terminals 29 (FIG. 4) which are arranged along three sides of a rectangular-shaped semiconductor chip 28, as shown in FIG. 4, in this particular embodiment. On the other hand, the outer terminal portions 44b of the conductive patterns 44 are arranged in correspondence to the inner ends of the leads 14 (FIG. 1) of the lead frame 2. Each segment 42 is cut along the rectangular-shaped line E into a single piece of insulative film 30, which is used to connect the chip 28 to the inner leads 14 of the lead frame 2, as mentioned below.

Using such an insulative film 30, the inner ends 44a and the outer terminal portions 44b of the conductive patterns 44 are heat-pressed to a plurality of terminals 29 of the chip 28 and a plurality of inner leads 14 of the lead frame 2, respectively, and a bonding process is carried out to simultaneously connect the film 30 to the corresponding chip 28 and lead frame 2.

According to such a film carrier type bonding as mentioned above, the bonding process can be easily and quickly carried out, since a plurality of terminals or leads are simultaneously bonded by a single flat insulative film having corresponding conductive patterns. Also, by using such a film carrier, the possibility of a short circuit between the individual patterns is eliminated, even if the distance from the chip to the inner leads is relatively long. As the conductive patterns are formed on an insulated film by etching, such patterns can be accurately and closely formed. Therefore, these film carriers are advantageous in use, particularly for a multi-pin type semiconductor device.

Contrary to the above, a conventionally known wire-bonding process requires time and labor consuming work, because these terminals and leads must be connected to bonding wires one by one. In addition, if the distance from the semiconductor chip to the leads is relatively long, and if there are many such leads, many long bending wires must be used, which would increase the possibility that the bonding wires would be interwined and short circuit therebetween when a wire-bonding or plastic-molding process is carried out.

The patterned insulative film 30 may be advantageously provided with several through holes 35 or slits 36 in order to facilitate a tight molding of the film 30 in the plastic material 32.

After the semiconductor chip 28 is electrically connected to the inner leads 14 by the film 30, the chip 28 and respective parts of the lead frame 2, i.e., the stage 10, the heat spreaders 12, and so forth, are integrally molded with a plastic material 32 over an area indicated by dotted lines A in FIG. 1, so that the outer leads 18 protrude outside the plastic mold 32. Then, the outer leads 18 are cut and separated from the transverse section bars 20 and the longitudinal rails 22 along dotted lines B. The dam bars 16 are also cut to separate individual inner outer leads 14 and 18 from each other along dotted lines C, and cut to separate support bars 15 from the stage along dotted lines D.

The foregoing is considered as illustrative only of the principles of the invention. Numerous modifications and changes will readily occur to those skilled in the art and it is not desired to limit the invention to the exact construction and applications shown and described. Accordingly, all suitable modifications and equivalents may be resorted to, falling within the scope of the invention and the appended claims and their equivalents.

What is claimed is:

1. A semiconductor device comprising:
a lead frame made of a metal strip including:
a rectangular stage;
at least one heat spreader extending outward from said rectangular stage for irradiating heat, said heat spreader having a substantially trapezoidal shape and having an edge which is one of a wave-shape, concave-shape, or convex-shape, for fixedly molding the heat spreader with a plastic material; and
a plurality of leads, each having inner and outer lead portions, inner ends of the inner lead portions being arranged along one or more sides of a rectangular area which is parallel to the periphery of said rectangular stage, said at least one heat spreader extending toward the inner ends of said inner lead portions from the periphery of said rectangular stage;
a semiconductor chip mounted on said stage and having a plurality of terminals;
means for electrically connecting said terminals of said semiconductor chip to respective ones of said inner lead portions; and
said plastic material for integrally molding said semiconductor chip, said connecting means, and said lead frame, so that at least said outer lead portions protrude outside said plastic material integrally molding said semiconductor chip.

2. A semiconductor device as set forth in claim 1, wherein said at least one heat spreader is bent in such a manner that a main part thereof is offset from said stage and positioned in the vicinity of an outer surface of said plastic material integrally molding said semiconductor chip.

3. A semiconductor device as set forth in claim 1, wherein said at least one heat spreader has one of slits and slots for fixedly molding said heat spreader with said plastic material.

4. A semiconductor device comprising:
a lead frame made of a metal strip including:
a rectangular stage;
at least one heat spreader extending outward from said rectangular stage for radiating heat, said at least one spreader having a substantially trapezoidal shape and having an edge having one of a wave-shape, concave-shape or convex shape for fixedly molding said heat spreader with a plastic material; and
a plurality of leads, each having inner and outer lead portions, inner ends of said inner lead portions being arranged along one or more sides of a rectangular area parallel to the periphery of said rectangular stage, said at least one heat spreader extending outward from the periphery of said rectangular stage toward the inner edges of said inner lead portions;
a semiconductor chip mounted on said stage and having a plurality of terminals;
an insulative film including a plurality of conductive patterns for electrically connecting said terminals of said semiconductor chip to said respective inner lead portions; and
said plastic material for integrally molding said semiconductor chip, said insulative film, and said lead frame, so that at least said outer lead portions protrude outside said plastic material integrally molding said semiconductor chip.

5. A lead frame made of a metal strip comprising:
a rectangular stage on which a semiconductor chip is mounted;
a plurality of leads having respective inner ends which are arranged along one or more sides of a rectangular area parallel to a periphery of said rectangular stage; and
at least one heat spreader having a substantially trapezoidal shape and having an edge having one of a wave-shape, concave shape, or convex shape, and extending from the periphery of said rectangular stage toward said inner ends of said leads arranged opposite thereto.

6. A semiconductor device as set forth in claim 5, wherein said at least one heat spreader is formed from one of slits and slots.